United States Patent [19]

Lewis et al.

[11] Patent Number: 5,483,423
[45] Date of Patent: Jan. 9, 1996

[54] EMI SHIELDING FOR COMPONENTS

[75] Inventors: Mark S. Lewis; Reuben M. Martinez, both of Colorado Springs; Ralph M. Tusler, Monument, all of Colo.

[73] Assignee: Digital Equipment Corporation, Maynard, Mass.

[21] Appl. No.: 375,041

[22] Filed: Jan. 9, 1995

Related U.S. Application Data

[63] Continuation of Ser. No. 153,735, Nov. 16, 1993, abandoned.

[51] Int. Cl.$^6$ ...................................................... H05K 9/00
[52] U.S. Cl. ........................... 361/816; 361/800; 361/818; 174/35 R; 174/35 TS; 439/108; 257/659
[58] Field of Search ..................................... 361/760, 761, 361/800, 814, 816, 818; 174/35 R, 35 GC, 35 TS; 439/109, 108, 607–609; 257/659

[56] References Cited

U.S. PATENT DOCUMENTS

| | | |
|---|---|---|
| 4,631,641 | 12/1986 | Brombal et al. . |
| 4,821,145 | 4/1989 | Corfits et al. . |
| 4,868,716 | 9/1989 | Taylor et al. . |
| 4,872,090 | 10/1989 | Taylor et al. . |
| 4,872,212 | 10/1989 | Roos et al. . |
| 5,084,802 | 1/1992 | Nguyenngoc . |
| 5,119,497 | 6/1992 | Freige et al. . |
| 5,250,751 | 10/1993 | Yamaguchi ........................ 174/35 GC |
| 5,323,299 | 6/1994 | Weber ...................................... 361/818 |

*Primary Examiner*—Leo P. Picard
*Assistant Examiner*—Young Whang
*Attorney, Agent, or Firm*—Krishnendu Gupta; Ronald C. Hudgens; Arthur W. Fisher

[57] ABSTRACT

This disclosure pertains to an apparatus and method of providing EMI shielding for an electrical component. The apparatus includes an elastomeric gasket, which is coated with a conductive jacket, and which is mounted on the backplane of a cabinet, the backplane providing EMI shielding. The cabinet is adapted for the insertion of a plurality of electrical components, such as disk drives, tape drives, and power supplies, which themselves are mounted in a rigid frame member. The frame member includes EMI shielding for the components on five of their six sides. The sixth side is unshielded, due to the fact that it contains the electrical connector used to connect the component to the backplane of the cabinet, when the frame member is inserted in the cabinet. With the frame member providing shielding on five sides, and the backplane providing shielding for the sixth side, the gasket serves the purpose of establishing an electrical seal between the frame member and the backplane of the cabinet.

15 Claims, 4 Drawing Sheets

5,483,423

EMI SHIELDING FOR COMPONENTS

This application is a continuation of application Ser. No. 08/153,735, filed Nov. 16, 1993 is now abandoned.

FIELD OF THE INVENTION

This invention relates to electromagnetic interference (EMI) shielding, and more particularly relates to providing EMI shielding through a device having shielding on five sides and a backplane with a shielding gasket.

BACKGROUND OF THE INVENTION

Modern computers are typically made up of a number of components which together form a complete computing system. For example, in addition to the central processing device and main memory, a given computer system may include separately housed tape drives, disk drives, or power supplies, with each such device being a separate and distinct component. Although such components are separate and distinct from one another, they are typically configured for modular insertion in a larger assembly, such as a structurally rigid frame, or cabinet. The cabinet thereby accommodates the easy insertion and removal of the individual devices for repair and replacement.

To the extent that the system allows for the easy insertion and removal of modular devices, it is necessary to consider the means by which the devices are shielded against EMI. Such EMI shielding is of particular concern when any one of the devices in the cabinet may be removed while other devices in the cabinet are still running. In other words, one particular concern is making sure that if any one of the devices is removed, while the others are still operating, the EMI shield for those devices still operating is not broken.

One approach to creating individual shielding for modular circuit boards is disclosed in U.S. Pat. No. 4,868,716, issued to Taylor on 19 Sep. 1989. In particular, Taylor discloses enclosing modular circuit boards within a five-sided enclosure. According to Taylor, shielding for the sixth side is provided by the top grounding plane of a base circuit board, a gasket made of an elongated strip of spring metal material, and a socket assembly made of fence strips and a metal insert. Accordingly, the provision of shielding on the sixth side in the Taylor device involves the use of these multiple components, which, at some point, are assembled together to implement the shielding approach.

What is needed, however, is a shielding approach for the modular components of a computer system which is reliable, inexpensive, and relatively straightforward to implement. More specifically, what is needed is an effective EMI shielding approach which uses as few components as possible.

SUMMARY OF THE INVENTION

This invention relates to an apparatus and method of providing inexpensive and practical EMI shielding for a variety of electrical components which are gang mounted in a cabinet. The apparatus includes a frame member for housing the electrical component that needs shielding. The frame member has an unshielded side which includes an edge which is conductive. The edge defines a closed geometric shape, and the edge is electrically conductive.

Additionally, the apparatus includes a sealing gasket, which has an elastomeric core over which is coated an electrically conductive surface. The gasket is mounted in the same geometric shape as the geometric edge defined by the edge of the frame. In this respect, the gasket is for the purpose of having the edge of the frame pressed into contact with the gasket so that a seal is created between the edge of the frame and the gasket.

Further embodiments of the invention include EMI shielding for the electrical component by the frame on all sides except for the one side that is unshielded. Additionally, the gasket is mounted on a backplane of a cabinet in which the frame is mounted, and the backplane provides EMI shielding. Thus, with the frame providing shielding on all sides but one, and the backplane providing shielding for the unshielded side when the frame is mounted in the cabinet, the seal establishes the electrical connections between the edge of the frame and the gasket.

Yet other embodiments of the invention relate to the method of mounting a frame member with a conductive edge in a geometric shape against an sealing gasket.

Advantageously, not only is the sealing arrangement practical and inexpensive to implement, it affords individual EMI protection for all of the electrical components in the cabinet. Consequently, with all of the components still operating, any one component could be removed from the cabinet without breaking the shield for the other.

Given that this description only briefly summarizes the invention, a more complete understanding of the invention, as well as its objects, features, and advantages will be appreciated upon consideration of the following detailed description of the preferred embodiment, presented in conjunction with the accompanying drawings, and the claims.

DETAILED DESCRIPTION OF THE PREFERRED EMBODIMENT

Figure 1:
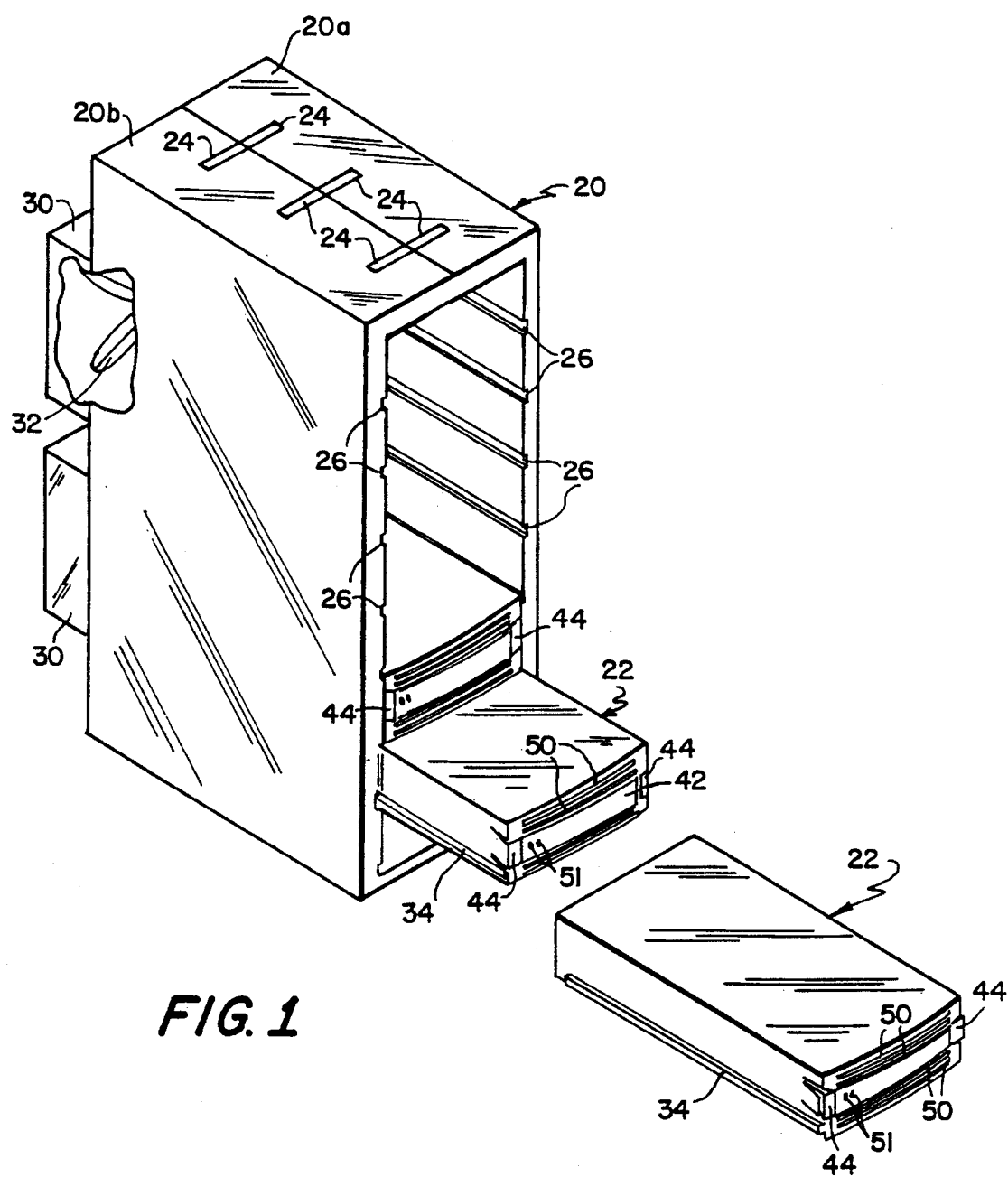
FIG. 1 provides an isometric view of a cabinet for the storage and EMI shielding of modularly inserted devices, one of which devices is shown to be fully inserted in the cabinet, another is partially inserted, and the third is outside the cabinet.

Referring now to FIG. 1, a cabinet 20 in accordance with the present invention is shown along with three modular devices 22. In the preferred embodiment cabinet 20 is comprised of two halves, respectively numbered 20a, 20b, which, when they are joined together, generally form a four-sided enclosure. To the extent that the two halves 20a, 20b are matingly joined with one another, each half includes complementary fasteners 24 which enable the halves to be easily snapped together to form cabinet 20. In this manner, cabinet 20 can be easily assembled after halves 20a, 20b are formed. Additionally, halves 20a, 20b of cabinet 20 may also be separated by the releasing of fasteners 24.

In accordance with the preferred embodiment, cabinet 20 is made of a glass filled PC/ABS. For example, the glass filled PC/ABS distributed under the trade name "Celstran PCG40-02-4" commercially available through Polymer Composite Incorporated has been found to be a suitable material for cabinet 20. The two halves 20a, 20b of cabinet 20 are made through an injection molding process. Accordingly, cabinet 20 is relatively inexpensive to fabricate, and its design may be easily changed in order to accommodate different size devices 22.

Figure 2:
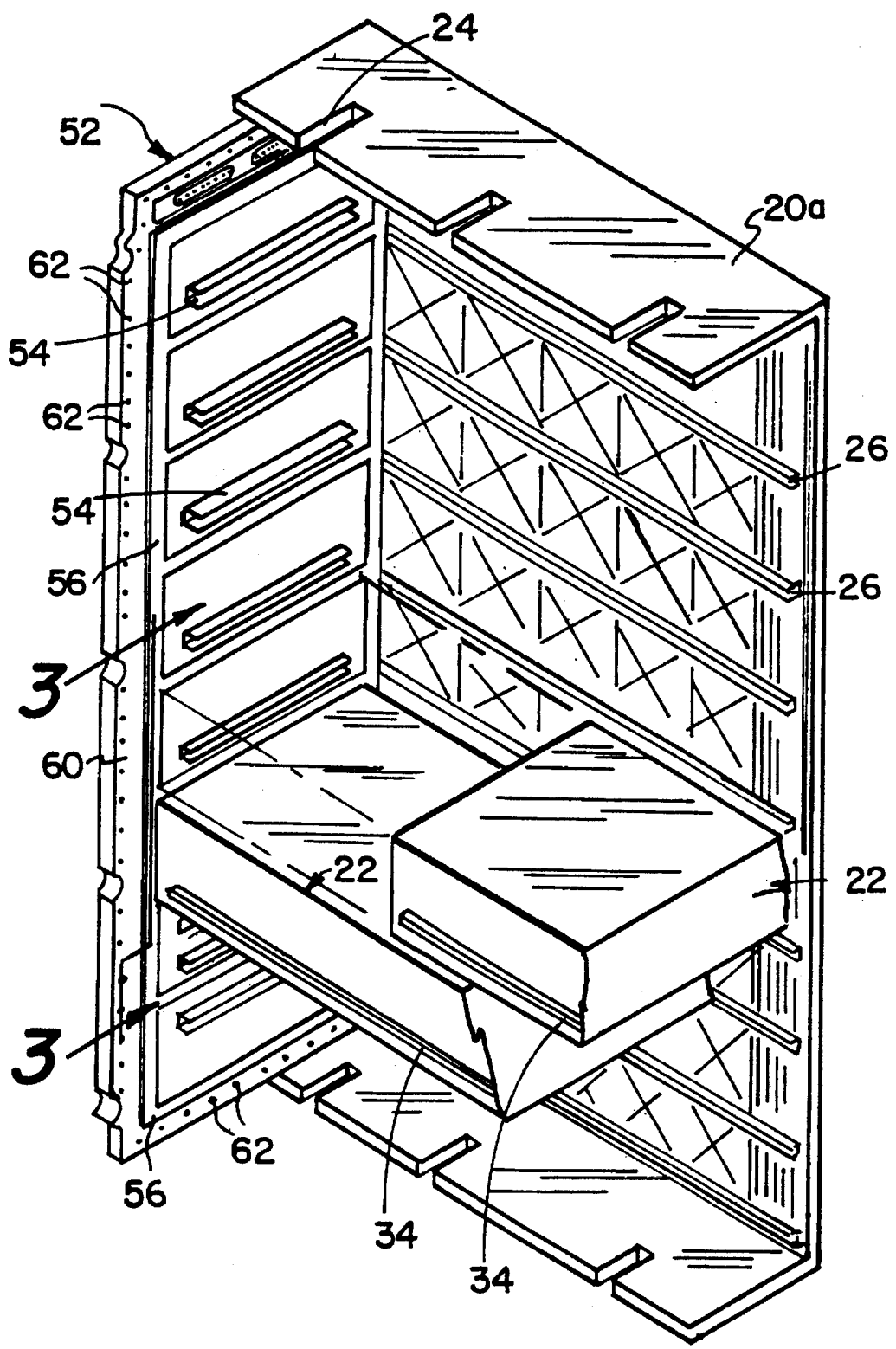
FIG. 2 provides a view similar to that of FIG. 1; however, in FIG. 2 one half of the cabinet has been sectioned away, and two sectioned devices are shown fully or partially inserted in the cabinet.

Additionally, as seen in FIGS. 1 and 2, each half of cabinet 20 includes a number of spaced and parallel channels 26, which are used for the purpose of mounting devices 22, as detailed below.

As shown in FIG. 1, extending from the backside of cabinet 20 are two fan covers 30, which generally enclose the fans 32 used for the purpose of cooling devices 22 mounted in cabinet 20. Fans 32, only one of which is seen from the partial sectional view of FIG. 1, are mounted in the rear portion of cabinet 20 and are used for the purpose of pulling or pushing ambient air through cabinet 20 in order to keep the devices 22 cooled while they are operating.

Also shown in FIG. 1 are three devices 22, one of which is fully inserted in cabinet 20, the second is partially inserted in cabinet 20, and the third is outside of cabinet 20. Although a given device 22 may be many types of modularly insertable electronic components requiring EMI shielding, the preferred embodiment of the invention is well adapted for devices 22 such as tape drives, disk drives, or power supplies. In the preferred embodiment, each device 22 requires shielding against EMI during operation.

Also in the preferred embodiment, device 22 is formed of a rigid, box-like enclosure which includes parallel rails 34 on the exterior of either side. Looking specifically at the device 22 which is outside cabinet 20, it can be seen, at least on one side, that rails 34 generally run the length of device 22. Each such pair of rails 34 is matingly designed and positioned relative to a corresponding pair of channels 26 in cabinet 20, such that device 22 can be inserted into cabinet 20 on rails 34. During insertion, the pair of rails 34 on the exterior of device 22 engage the corresponding channels 26 so that device 22 slides smoothly within cabinet 20.

Figure 3:
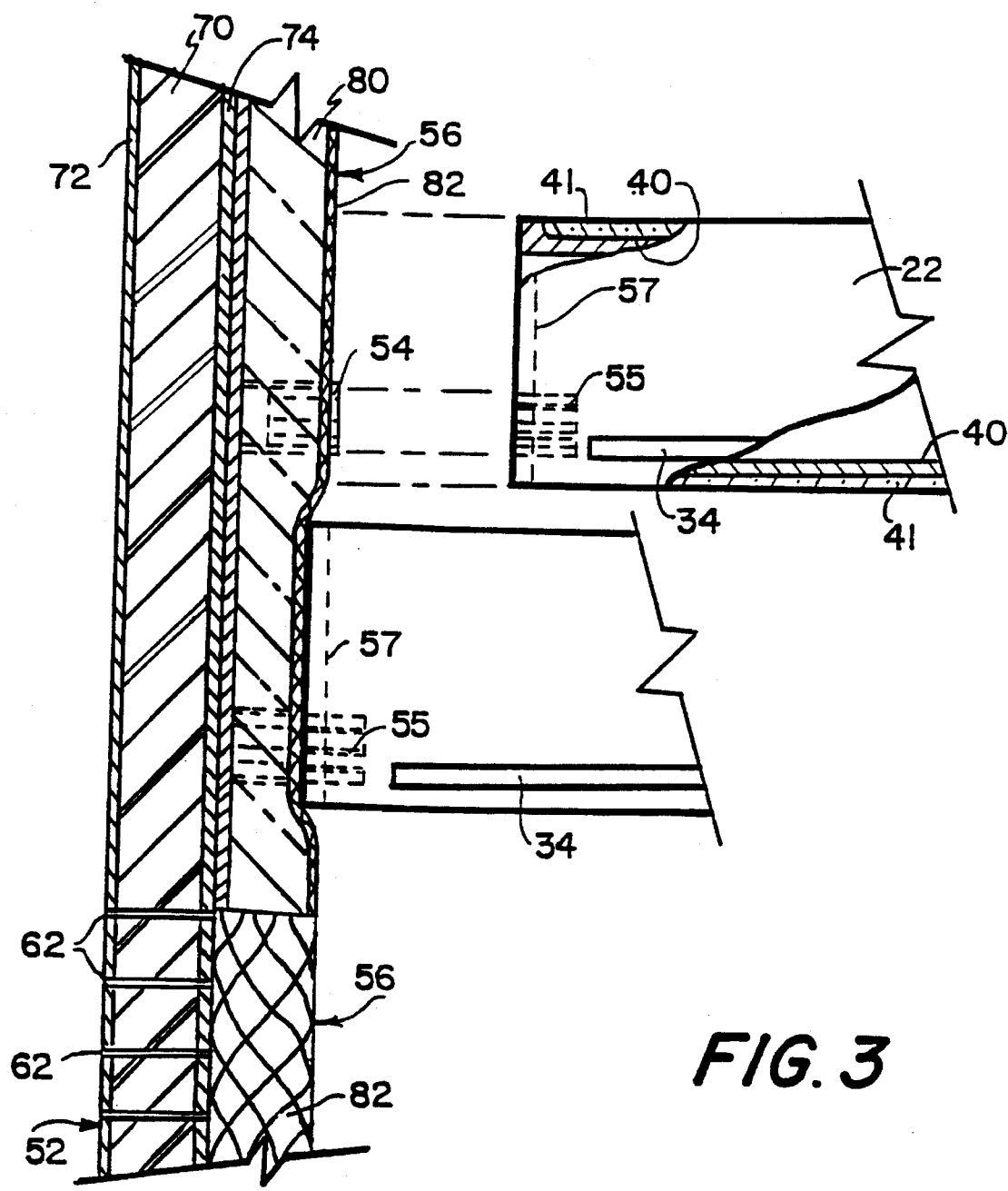
FIG. 3 provides a more detailed, offset, sectioned view of a portion of the cabinet and devices shown in FIGS. 1 and 2, the offset section being shown by line 3—3 on FIG. 2.

As will be detailed further in connection with the discussion of FIG. 3, the enclosure forming device 22 is made of a molded, plastic frame, the inside of which is plated with a conductive metallic layer. Although the plastic frame and metallic layer of device 22 is not detailed in FIG. 1, in FIG. 3 the plastic frame is shown as reference numeral 41 and the inside metallic layer is shown as reference numeral 40. To the extent that metallic layer 40 surrounds the electrical component, such as a disk drive, tape drive, or power supply, that is housed within device 22, that metallic layer operates as a portion of the EMI shield for device 22. More specifically, the metallic layer 40 encapsulating the plastic frame 41 operates as a shield against EMI on four sides of device 22.

A fifth side of device 22, namely the front side as shown in FIG. 1, is shielded by means of front cover 42. As with the four sides of device 22, front cover 42 is likewise made of molded plastic, the inside of which is coated with a metallic layer. When front cover 42 is attached to frame 41, the metallic coating on the inside of front cover 42 is conductively coupled with the metallic coating on the inside of frame 41. Thus, with the four sides and the front side of device 22 provided with EMI shielding, it is only the backside of device 22, meaning the side of device 22 which mounts against a backplane inside cabinet 20, which is unshielded. As discussed below, however, when device 22 is mounted within cabinet 20 the backplane provides shielding on the sixth side of each individual device 22, such that if any given device 22 is withdrawn from the cabinet 20 all of the other still operating devices 22 will remain shielded.

Still referring to FIG. 1, each front cover 42 includes a pair of oppositely positioned snaps 44. When device 22 is fully inserted cabinet 20, snaps 44 are automatically depressed inward until they matingly engage the sides of cabinet 20. Through such mating engagement, snaps 44 hold device 22 securely in place. If device 22 is to be removed from cabinet 20, however, snaps 44 may be pinched inwardly thereby releasing device 22 from cabinet 20.

Also shown on FIG. 1, front cover 42 includes ventilation slots 50, which allow the passage of air through the enclosure of device 22, which facilitates the cooling of device 22. The physical dimensions of ventilation slots 50 may be adjusted in order to insure that the EMI radiated by the electrical component, which is included in device 22, is reduced to at least applicable EMI radiation standards. Additionally, cover 42 includes a number of LEDs 51 which are electrically coupled to the electronic component of device 22 to show the operating status of a given device 22.

Referring now to FIG. 2, an illustration similar to that shown in FIG. 1 is provided; however, in FIG. 2 half 20b of cabinet 20 has been removed showing greater details relating to the interior of cabinet 20. Additionally, in FIG. 2 sectioned views of two devices 22, one partially and the other fully inserted in cabinet 20, are provided. It should be noted in connection with the consideration of FIG. 2, however, that the internal electrical componentry of device 22 is not shown because it is not needed for this detailed explanation.

As seen in FIG. 2, channels 26 originally shown in FIG. 1 can now be seen to extend from the front of cabinet 20 to backplane 52 of cabinet 20 so that each provides a smooth, defined path in which the corresponding rails 34 of device 22 may slide. In the particular embodiment shown in FIG. 2, cabinet 20 includes a cross-bar construction that tends to give cabinet 20 enhanced rigidity and structural integrity.

Mounted in the rear of cabinet 20, and forming a fifth wall to cabinet 20, is backplane 52. In the preferred embodiment, backplane 52 is made of an epoxy glass FR4 material, copper, and a solder plating. Further details relating to the composition and construction of backplane 52 are provided below in connection with the discussion of FIG. 3.

Referring to both FIG. 1 and FIG. 2, it can be understood that without devices 22 inserted in cabinet 20, cabinet 20 is effectively a hollow, box-like structure, with the halves 20a, 20b of cabinet 20 forming four sides of the box, and backplane 52 forming the fifth side of the box. As seen in the drawings, the hollow interior portion of cabinet 20 accommodates the modular insertion of devices 22. In the preferred embodiment, cabinet 20 is capable of accommodating up to eight devices 22.

As detailed below, when devices 22 are fully inserted in cabinet 20, they make a physical connection with backplane 52. That physical connection not only establishes a path for electrical power and the exchange of signals between devices 22 and backplane 52, but also establishes the physical connection by which the EMI shielding of the sixth side of device 22 is accomplished.

Still referring to FIG. 2, mounted on backplane 52 are a number of backplane connectors 54. Each backplane connector 54 is designed to matingly engage a device connector, which is mounted on the backside of device 22 and is shown on FIG. 3 as reference number 55. Accordingly, when a given device 22 is fully inserted, backplane connector 54 will matingly engage device connector 55 to establish the conductive paths by which electric signals are passed between device 22 and backplane 52. In the preferred embodiment, backplane connector 54 and device connector 55 are in a pin and socket configuration such that with device 22 fully inserted within cabinet 20 pins protruding from backplane connector 54 will be matingly inserted within corresponding sockets in device connector 55.

Still focusing on backplane 52, also mounted on backplane 52 is shielding gasket 56, the detailed description of which is provided below. In the preferred embodiment, gasket 56 is adhesively mounted on the inside of backplane 52 in a manner which establishes a number of adjoining rectangular patterns, with a given backplane connector 54 being generally in the center of each such rectangle. The specific spacing and dimension of each rectangle is positioned to matingly accommodate the rectangular shape of the back edge of a given device 22, when device 22 is fully inserted within cabinet 20.

To the extent that gasket 56 is commercially available in strips of virtually any length, in practical implementations gasket 56 may be formed of a number of individual segments of material sectioned and adhered in the specific geometric pattern necessary to accommodate the rear edges of the given devices 22 to be mounted in cabinet 20.

In the preferred embodiment, the inside of backplane 52 is coated with an insulative coating on that portion of backplane 52 which is within the perimeter of gasket 56. On the other hand, the perimeter of backplane 52 is uncoated thereby forming a conductive strip 60, which surrounds the interior perimeter of the entire backplane 52. As will be further explained below, the inside surface of backplane 52 is actually a copper grounding plane. Thus, the portion of that inside grounding plane surface which is not coated with the insulative coating is what is designated as the conductive strip 60.

Additionally, as shown in FIGS. 2 and 3, disposed around the perimeter of backplane 52 are a number of grounding stitches 62. In the preferred embodiment, stitches 62 are solder plated through hole vias that are drilled through backplane 52 within the area defined by the conductive strip 60. Each via has an annular ring exposed on the two outer surfaces of backplane 52. The connection between pairs of annular rings, one being on the inside plane and the other on the outside plane of backplane 52, is established by means of solder which is made to flow during a solder reflow process. In practical applications, each stitch 62 has a finished hole diameter of 0.038 inches, and each stitch 62 is separated from adjoining stitches 62 by approximately 0.5 inches.

Also shown in FIG. 2, devices 22 that are positioned in cabinet 20 in an adjoining relationship, with one device 22 positioned immediately above the other, share a horizontally positioned portion of gasket 56 to create the shielding seal for their respective lower and upper lateral edges. In other words, when two adjoining devices 22 are fully inserted in cabinet 20 the bottom horizontal edge of the upper positioned device 22 shares a lateral portion of gasket 56 with the top horizontal edge of the lower positioned device 22.

The vertically positioned portions of gasket 56 engage the side edges of each device 22.

It should be noted that the particular geometric shape of the rear edge of frame 41 is rectangular; however, in other implementations it could be another shape. Aside from the fact that the preferred embodiment of frame 41 is naturally rectangular, the rectangular shape is one which defines a continuous and closed geometric pattern having a defined inside and outside. To the extent that the objective of the mating of device 22 with gasket 56 is to establish a seal, the closed geometric pattern facilitates the accomplishment of this objective.

In the preferred embodiment, gasket 56 includes an adhesive strip that runs lengthwise along the exterior of gasket 56. Thus, when gasket 56 is cut in its desired length, it can be adhesively mounted on backplane 52 in the area of conductive strip 60. Even though the glue comprising the adhesive makes contact with conductive strip 60, on either side of the adhesive the conductive portions of gasket 56 are in conductive contact with conductive strip 60.

When device 22 is slid into cabinet 20 for mating engagement with backplane 52, the rectangularly shaped rear edge of device 22 compressively engages the matingly configured shape of shielding gasket 56. For purposes of this explanation, the term "compressively engages" means that one edge surface is pressed against another edge surface; in this instance the edge surface of the rear portion of device 22 is pressed against the external conductive surface of gasket 56. It should be noted that metallic layer 40 is disposed on the back side of frame 41 such that it provides an exposed, conductive edge surface which can be press mounted against shielding gasket 56. When so mounted, a conductive connection is thereby established between the metallic layer 40 of device 22 and the shielding gasket 56.

To the extent that it is necessary for backplane 52 and device connectors 54,55 to matingly engage, and for the back side of device 22 to matingly engage gasket 56, in practical implementations the dimensional spacing of connectors 54, 55 and gasket 56 are such that mating connections are made by all such elements with device 22 securely inserted in cabinet 20.

Referring now to FIG. 3, a side sectional view of backplane 52 shown in FIG. 2 is provided, as the backplane 52 is sectioned by the offset sectional line 3—3 in FIG. 2. In FIG. 3 it can be seen that backplane 52 is made of three principle layers. Specifically, the inner layer 70 is made of the epoxy glass FR4 which is sandwiched between two solid copper ground planes 72, 74. Thus, planes 72, 74 are actually flat conductive plates forming the two large sides of backplane 52. As broad conductive plates which are conductively coupled with an electrical ground, planes 72, 74 generally form the EMI shield for the sixth side of each device 22, when it is inserted in cabinet 20.

Additionally, from the side sectional, offset view, a few of stitches 62, which extend around the periphery of backplane 52 and which conductively couple plane 72 with plane 74, can be seen. To the extent that ground stitches 62 extend around the periphery of backplane 52, as shown on FIG. 2, any EMI that is generated by the electrical circuitry that is internal to backplane 52 and that may have a tendency to escape from the four thin sides of backplane 52, is effectively trapped by grounding stitches 62 so that any EMI which may escape from the sides of backplane 52 is reduced to at least the applicable regulatory standards. Accordingly, not only do the two planes provide an EMI shield along the two large sides (ie. front and back) of backplane 52, but also grounding stitches 62 provide an EMI shield around the four thin sides of backplane 52.

Also seen in FIG. 3 is an enlarged view of gasket 56, which, is an elastomeric, foam rubber like core 80, coated with a conductive jacket 82. To the extent that gasket 56 actually has an elastomeric consistency, it will deform against the compressive force of device 22 when fully inserted in cabinet 20. As discussed above, the grounding planes of backplane 52 generally provide an EMI shield for the back side of each device 22 that is fully inserted in cabinet 20. Furthermore, through the compression of gasket 56 by the rear conductive edge of device 22, a seal is formed between the gasket 56 and the rear edge of frame 41, thereby providing an EMI seal between device 22 and backplane 52.

Referring once again to FIG. 3, from the side section view it can be seen that backplane connector 54 is mounted on backplane 52 and device connector 55 is mounted on device 22. In FIG. 3 portions of backplane connectors 54 and device connectors 55 are shown in phantom, due to the fact that they are hidden from view by gasket 56 or the sides of devices 22. Also shown in phantom lines is back plate 57, which forms the back side of device 22. In the preferred embodiment, back plate 57 is not a solid wall; rather, it has a number of openings (not shown), such as an opening through which device connector 55 may project.

As seen from the view provided in FIG. 3, back plate 57 is recessed somewhat from the rear most portion of frame 41 in order to accommodate the rearward extension of device connector 55. In the preferred embodiment, the extension of the rear portion of frame 41 relative to back plate 57 facilitates the compressive engagement of the perimeter of the rear perimeter edge of device 22 against gasket 56.

In FIG. 3, one of devices 22 has been inserted all the way into cabinet 20 such that its device connector 55 has established mating engagement with its corresponding backplane connector 54. On the other hand, another device 22 which has not yet been fully inserted within cabinet 20 is also shown. From the dashed line provided in FIG. 3, however, it can be seen that when the second device 22 is further inserted, its device connector 55 would mate with the corresponding backplane connector 54.

Referring now to the device 22 in FIG. 3 that is shown to be fully inserted within cabinet 20, it can be seen that when the device 22 is fully inserted it will have a tendency to compress gasket 56 and thereby cause a slight, elastic deformation. Through the compressive engagement of the conductive jacket 82 of gasket 56 with the conductive, metallic layer 40 which coats the rear edge perimeter of device 22, an EMI seal is established between device 22 and backplane 52. Therefore, recalling that each device 22 is EMI shielded on five of its sides by the metallic layers 40 on the insides of frame 41 and front cover 42, it can now be seen that backplane 52 provides that shield for the sixth side.

FIG. 3 further provides additional views of the construction of frame 41 of device 22. In particular, FIG. 3 includes a partial sectioned view of device 22, such that it can be seen that device 22 includes frame 41, the inside of which is plated with metallic layer 40, which forms the EMI shield of the device 22, as detailed above. Additionally, from the sectioned view of the rear portion of the device 22 that is not compressed against gasket 56, it can be seen that metallic layer 40 coats over the rear portion of the plastic frame 41 to create the conductive rear edge of device 22. As indicated, that conductive edge makes contact with gasket 56, when device 22 is fully inserted.

In preferred embodiments, the frame 41 of device 22 is a plastic, such as the plastic sold by Mobay under the trade name "Mobay Blend" having the model number FR1441-9189. As a plastic, frame 41 can be made through an injection molding process, and can be readily adapted to accommodate different configurations of the components that may comprise devices 22 in varying applications.

After molding, plastic frame 41 is then selectively plated on its interior in order to coat the interior with metallic layer 40, shown in FIG. 3. In particular, metallic layer 40 is formed of an electroless nickel plating. In preferred embodiments, the plastic frame 41 may have a thickness of 0.090 inches, and the metallic layer 40 has a preferred minimum thickness of 0.00001 inches, yielding a plating surface resistivity of 0.1 ohms per square inch.

As indicated above, and although not separately detailed, it will be understood that the composition of and construction process of front cover 42 is generally the same as that detailed in connection with frame 41. On the other hand, the construction of front cover 42 varies somewhat relative to frame 41 due to the fact that front cover 42 includes snaps 44, ventilation slots 50, and LED's 51.

Figure 4A:
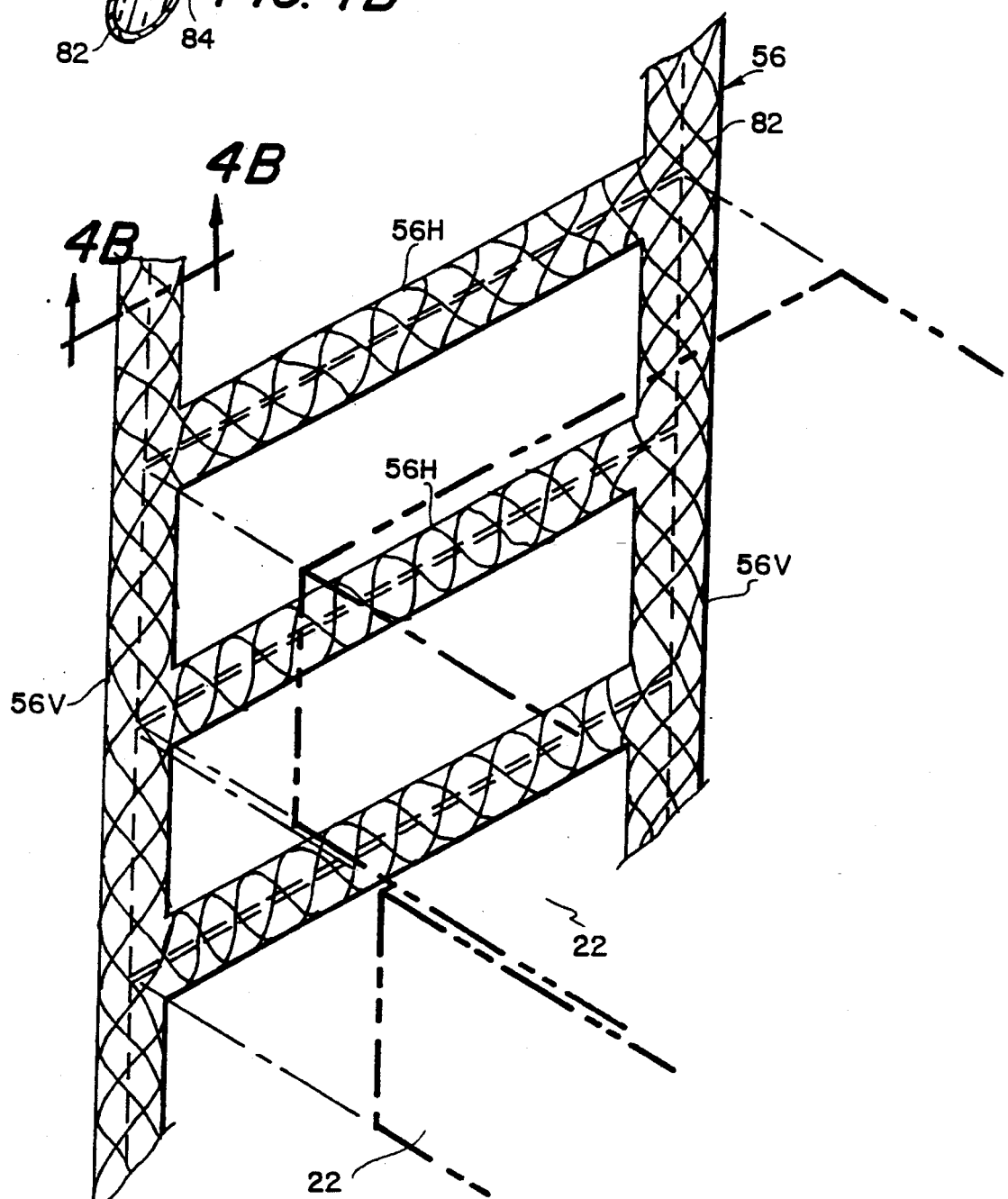
FIG. 4A provides an enlarged, partial view of the shielding gasket and the rear portions of two devices shown in phantom.

Referring now to FIG. 4A, an enlarged, oblique, sectioned view is provided with respect to gasket 56 and its mating relationship with the back side edge of device 22; however cabinet 20, backplane 52, and backplane connectors 54 are not shown. As seen in FIG. 4A, in which devices 22 are shown in phantom illustration, when one device 22 is positioned immediately above the other in cabinet 20, they will share a horizontally positioned portion 56H of gasket 56. That shared portion of the horizontally positioned gasket 56 will create the shielding seal for their respective lower and upper lateral edges of the two devices 22. As indicated above, the vertically positioned portions 56V of gasket 56 engage the side edges of each device 22. Also, from the illustration of FIG. 4A, the conductive jacket 82 which covers gasket 56 is shown in enlarged detail.

Figure 4B:
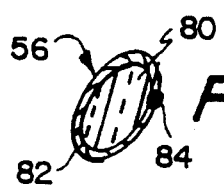
FIG. 4B provides a cross sectional view of the shielding gasket shown in FIG. 4A, as sectioned by the line 4B—4B in FIG. 4A.

FIG. 4B provides a view of gasket 56 shown in FIG. 4A, as sectioned along the line 4B—4B. In FIG. 4B it can now be seen that in the preferred embodiment gasket 56 is made up of a thermoplastic EPDM foam rubber core 80. Core 80 is coated with conductive jacket 82, which is a mesh material on the surface of core 80 and which is made of a silver plated, nylon yarn knit. Additionally, FIG. 4B shows adhesive 84 which is used to glue gasket 56 to a surface, such as backplane 52; however, when so glued on a surface, the conductive portions on either side of the adhesive make physical contact with the surface to which gasket 56 is adhered.

The particular gasket used in the preferred embodiment is distributed by Chomerics, Inc. of 1616 East Main, Suite 206, Arizona 85203. The foam core has a specified compression force of 0.60 lbs/in (max) for 30% deflection and 1.70 lbs/in (max) for 50% deflection. The adhesive is a pressure sensitive double adhesive transfer tape with easy release liner. The transfer tape has a minimum peel strength of 2.0 ppi. Through conductive jacket 82, gasket 56 has a maximum contact resistance of 1.0 ohms/inch, and provide 60 dB (minimum) of EMI shielding from 50 MHz to 1 GHz for deflection ranging from 30%–50%.

In connection with this detailed description certain types of devices and structural components have been specifically identified. It will be clear to those skilled in the art that other such devices and structural components may be substituted for those shown and discussed. Accordingly, the invention in its broader aspects is not limited to the specific details, representative apparatus, and illustrative examples shown and described herein. Thus, departures may be made from such details without departing from the spirit or scope of the invention.

What is claimed is:

1. Apparatus for shielding an electrical component comprising:

a container for holding the electrical component, the container being shielded against EMI emissions on all sides except one the unshielded side having an electrically conductive edge which defines a geometric shape;

a cabinet for holding the container, the cabinet including a wall constructed to shield EMI emissions; and a gasket on the interior surface of the wall, the gasket having an elastomeric core and an electrically conductive outer surface, the gasket being in the given geometric shape such that with the electrically conductive edge of the unshielded side of the container in pressed contact with the outer surface of the gasket an electrical connection is established between the edge and the gasket.

2. The apparatus as in claim 1, wherein said core is an electrically insulative material.

3. The apparatus as in claim 2, wherein said insulative material is foam rubber.

4. The apparatus as in claim 2, wherein said gasket surface includes a conductive mesh.

5. The apparatus as in claim 1, wherein the container for holding the electrical component includes a plating of electrically conductive material which is electrically coupled to the electrically conductive edge.

6. The apparatus as in claim 5, wherein said conductive plating comprises a shield against EMI.

7. Apparatus for EMI shielding an electrical component comprising:

a cabinet including a backplane constructed to shield EMI emissions and having an opening on one side thereof;

a container for holding an electrical component, the container including a side having a component connector, the container being effective to shield an electrical component held therein from EMI emissions on all sides except the side with the component connector, the unshielded side of the container having an exteriorly exposed closed narrow electrically conductive surface extending around the outer boundary region of such side, the container having a shape and dimensions for insertion in the cabinet through the opening; and a resilient electrically conductive surface on the interior of the backplane conforming in shape and size to the exteriorly exposed electrically conductive surface, the electrically conductive surface being positioned on the backplane so that when the container is in position in the cabinet such resilient electrically conductive surface engages the conductive surface on the unshielded side of the container to form electrical contact therewith.

8. The apparatus of claim 7 wherein the electrically conductive surface on the interior of the backplane is formed by a conductive outer cover of a gasket.

9. The apparatus as in claim 8, wherein the gasket includes an electrically insulated elastomeric core.

10. The apparatus as in claim 9, wherein said core is made of foam rubber.

11. The apparatus as in claim 9, wherein said gasket includes a conductive mesh over said core.

12. The apparatus of claim 7 wherein the interior surfaces of the container on all sides are formed of an electrically conductive metallic material except the side with the component connector.

13. The apparatus of claim 12 wherein the container is formed of plastic.

14. A method of shielding an electrical component comprising the steps of:

inserting a frame member which houses an electrical component into a cabinet, the frame member having a plurality of sides, one of which is unshielded against the emission of EMI, said unshielded side having an opening defined by an electrically conductive edge in a given geometric shape; and compressively engaging a sealing gasket with the edge, the sealing gasket having an elastomeric core with a conductive surface and being mounted in the cabinet in the same geometric shape as the edge.

15. Apparatus for EMI shielding an electrical component comprising:

a cabinet including a backplane constructed to shield EMI emissions and having an opening on one side thereof;

a plastic container for holding an electrical component, the container including side, top, bottom, back walls, and a front cover, the interior of the side, top, and bottom walls and the front cover being coated with a metallic layer effective to shield against EMI emissions, the back wall having a component connector, the unshielded back wall of the container having an exteriorly exposed closed narrow electrically conductive surface extending around the outer boundary region of such back wall, the container having a shape and dimensions for insertion in the cabinet through the opening; and a resilient electrically conductive surface on the interior of the backplane conforming in shape and size to the exteriorly exposed electrically conductive surface, the electrically conductive surface on the interior of the backplane is formed by a conductive outer cover of a gasket, the gasket includes an electrically insulated elastomeric core, the electrically conductive surface being positioned on the backplane so that when the container is in position in the cabinet such resilient electrically conductive surface engages the conductive surface on the unshielded back wall of the container to form electrical contact therewith.

* * * * *